(12) United States Patent
Xanthopoulos et al.

(10) Patent No.: US 10,784,871 B1
(45) Date of Patent: Sep. 22, 2020

(54) CLOCKING ARCHITECTURE FOR DVFS WITH LOW-FREQUENCY DLL LOCKING

(71) Applicant: MARVELL ASIA PTE, LTD., Singapore (SG)

(72) Inventors: Thucydides Xanthopoulos, Watertown, MA (US); Nitin Mohan, Northborough, MA (US)

(73) Assignee: MARVELL ASIA PTE, LTD., Singapore (SG)

( * ) Notice: Subject to any disclaimer, the term of this patent is extended or adjusted under 35 U.S.C. 154(b) by 0 days.

(21) Appl. No.: 16/528,381

(22) Filed: Jul. 31, 2019

Related U.S. Application Data

(60) Provisional application No. 62/786,790, filed on Dec. 31, 2018.

(51) Int. Cl.
| | |
|---|---|
| *H03L 7/08* | (2006.01) |
| *H03L 7/081* | (2006.01) |
| *G06F 1/08* | (2006.01) |
| *H03K 5/14* | (2014.01) |
| *H03K 5/00* | (2006.01) |

(52) U.S. Cl.
CPC .............. *H03L 7/0802* (2013.01); *G06F 1/08* (2013.01); *H03K 5/14* (2013.01); *H03L 7/0812* (2013.01); *H03K 2005/00019* (2013.01); *H03K 2005/00078* (2013.01)

(58) Field of Classification Search
CPC ....... G06F 1/04; G11C 7/222; H03L 2207/06; H03L 2207/50; H03L 7/07; H03L 7/087; H03L 7/0802
USPC .................................. 327/147–149, 156–158
See application file for complete search history.

(56) References Cited

U.S. PATENT DOCUMENTS

| | | |
|---|---|---|
| 6,600,345 B1 | 7/2003 | Boutaud |
| 6,686,785 B2 | 2/2004 | Liu et al. |
| 7,551,909 B1 * | 6/2009 | Moon .................... H03L 7/0812 331/19 |
| 7,764,095 B2 * | 7/2010 | Werner ...................... G06F 1/04 327/158 |

(Continued)

OTHER PUBLICATIONS

Senger, et al., "Low-Latency, HDL-Synthesizable Dynamic Clock Frequency Controller with Self-Referenced Hybrid Clocking," IEEE, ISCAS 2006.

(Continued)

*Primary Examiner* — Adam D Houston
(74) *Attorney, Agent, or Firm* — Hamilton, Brook, Smith & Reynolds, P.C.

(57) ABSTRACT

A circuit and corresponding method for dynamic voltage frequency scaling (DVFS) on a chip employ a delay-locked loop (DLL)-based clocking architecture. The circuit comprises a DLL including a fixed delay line path, with a first insertion delay, and variable delay line path, with a second insertion delay, and a clock generator. The clock generator is configured to source a DLL input clock to the fixed and variable delay line paths at a start-up frequency prior to a run-time frequency. The start-up frequency is lower relative to a target frequency for the chip. The run-time frequency is configured based on DVFS, following release of the chip from reset. The chip is configured to be released from reset with the DLL locked at the start-up frequency, enabling the second insertion delay to match the first insertion delay with the DLL locked at the start-up frequency.

32 Claims, 7 Drawing Sheets

(56) References Cited

U.S. PATENT DOCUMENTS

| | | |
|---|---|---|
| 7,952,404 B2 | 5/2011 | Petrie |
| 7,971,088 B2 | 6/2011 | Jung et al. |
| 9,425,779 B2 | 8/2016 | Jung |
| 9,654,121 B1 * | 5/2017 | Chu .................. H03L 7/0992 |
| 10,530,370 B1 * | 1/2020 | Mohan .................. H03K 19/20 |
| 2002/0079937 A1 | 6/2002 | Xanthopoulos |
| 2002/0097592 A1 | 7/2002 | Komurasaki et al. |
| 2012/0068748 A1 | 3/2012 | Stojanovic et al. |
| 2013/0238309 A1 | 9/2013 | Ting et al. |
| 2014/0327478 A1 * | 11/2014 | Horng .................. H03L 7/18 |
| | | 327/157 |
| 2014/0347107 A1 * | 11/2014 | Kim .................. H03L 7/095 |
| | | 327/158 |
| 2015/0162921 A1 * | 6/2015 | Chen .................. H03L 7/087 |
| | | 327/157 |
| 2015/0213873 A1 * | 7/2015 | Joo .................. H03L 7/083 |
| | | 365/154 |
| 2016/0013796 A1 * | 1/2016 | Choi .................. H03L 7/095 |
| | | 327/158 |
| 2016/0077572 A1 * | 3/2016 | Chang .................. G06F 1/3296 |
| | | 713/320 |
| 2018/0351770 A1 | 12/2018 | Chiu et al. |
| 2019/0007055 A1 * | 1/2019 | Nelson .................. G06F 1/12 |
| 2020/0044657 A1 * | 2/2020 | Pi .................. H03L 1/026 |
| 2020/0076439 A1 * | 3/2020 | Weeks .................. H03L 7/0805 |
| 2020/0076440 A1 * | 3/2020 | Ng .................. H03L 7/23 |
| 2020/0083891 A1 * | 3/2020 | Huh .................. H03L 7/087 |

OTHER PUBLICATIONS

Sidiropoulos, et al., "A Semidigital Dual Delay-Locked Loop," IEEE Journal of Solid-State Circuits, vol. 32, No. 11, Nov. 1997.

Zoni, et al., "A DVFS Cycle Accurate Simulation Framework with Asynchronous NoC Design for Power-Performance Optimizations," J. Sign. Process Syst., published online Mar. 24, 2015.

* cited by examiner

CLOCKING ARCHITECTURE FOR DVFS WITH LOW-FREQUENCY DLL LOCKING

RELATED APPLICATION

This application claims the benefit of U.S. Provisional Application No. 62/786,790, filed on Dec. 31, 2018. The entire teachings of the above application are incorporated herein by reference.

BACKGROUND

Dynamic Voltage and Frequency Scaling (DVFS) is a common power management technique in high-performance processors where the clock frequency of a processor clock is decreased to allow a corresponding reduction in the supply voltage, thereby reducing power consumption. A clock generator of the processor clock may be implemented using a phase-locked loop (PLL) to easily change the clock frequency.

A PLL is a negative feedback system that locks a phase and frequency of a higher frequency device, usually a voltage controlled oscillator (VCO), whose phase and frequency are not very stable over temperature and time, to a more stable and lower frequency device, usually a temperature compensated or oven controlled crystal oscillator. A PLL is typically employed when there is a need for a high frequency local oscillator (LO) source. A delay-locked loop (DLL) is a digital circuit similar to a phase-locked loop (PLL), with the main difference being the absence of the VCO, replaced by a delay line.

SUMMARY

According to an example embodiment, a circuit for dynamic voltage frequency scaling (DVFS) on a chip may comprise a delay-locked loop (DLL) including a fixed delay line path with a first insertion delay, a variable delay line path with a second insertion delay, and a clock generator. The clock generator may be configured to source a DLL input clock to the fixed and variable delay line paths at a start-up frequency prior to a run-time frequency. The start-up frequency may be lower relative to a target frequency for the chip. The run-time frequency may be configured based on DVFS, following release of the chip from reset. The chip may be configured to be released from reset with the DLL locked at the start-up frequency, enabling the second insertion delay to match the first insertion delay with the DLL locked at the start-up frequency.

The clock generator may be further configured to increase the run-time frequency of the DLL input clock from the start-up frequency to the target frequency following release of the chip from reset. The second insertion delay is matched with the first insertion delay with the DLL locked at the target frequency.

The clock generator may be further configured to increase the run-time frequency of the DLL input clock, gradually, by increasing the run-time frequency to at least one intermediate frequency. The at least one intermediate frequency may be higher relative to the start-up frequency and lower relative to the target frequency. The second insertion delay is matched with the first insertion delay with the DLL locked at each at least one intermediate frequency.

The circuit may further comprise a reset sequence circuit configured to release the DLL and chip from reset, sequentially, by releasing the DLL from reset prior to releasing the chip from reset.

The reset sequence circuit may be further configured to release the DLL and chip from reset, sequentially, in response to an indication that power of the chip is stable.

The clock generator may be further configured to source the DLL input clock at the start-up frequency in response to an indication that power of the chip is stable.

The DLL may be configured to lock, initially, at the start-up frequency, following release of the DLL from reset and prior to release of the chip from reset.

The clock generator may include multiple phase-locked loops (PLLs) and a clock selector. The clock selector may be configured to select a given phase-locked loop (PLL) of the multiple PLLs to source the DLL input clock at the start-up frequency, the given PLL programmed at the start-up frequency.

The clock selector may be further configured to select the given PLL programmed at the start-up frequency in response to an indication that power of the chip is stable.

The clock selector may be further configured to select a different PLL from the multiple PLLs to source the DLL input clock at a higher frequency following release of the chip from reset, wherein the higher frequency is higher relative to the start-up frequency and wherein the different PLL is different from the given PLL.

The DLL may further include a finite state machine (FSM). The DLL may be configured to be released from reset via release of the FSM from reset. The FSM may be configured to be released from reset (i) in response to an indication that power of the chip is stable and (ii) prior to release of the chip from reset.

The DLL may further include a phase detector and a finite state machine (FSM). The phase detector may be coupled to the fixed and variable delay line paths and the FSM. The circuit may be configured to input the DLL input clock to the fixed and variable delay line paths, the fixed delay line path configured to output a reference clock to the phase detector, the variable delay line path configured to output a feedback clock to the phase detector. The phase detector may be configured to generate a phase difference based on a comparison of respective phases of the reference and feedback clocks. The FSM may be configured to control delay of the variable delay line path as a function of the phase difference.

The fixed delay line path may include a fixed delay line circuit and first clock distribution circuit, the first clock distribution circuit interposed between the fixed delay line circuit and the phase detector. The variable delay line path may include a variable delay line circuit and second clock distribution circuit, the second clock distribution circuit interposed between the variable delay line circuit and the phase detector. The FSM may be further configured to control delay of the variable delay line path by controlling a variable delay of the variable delay line circuit as a function of the phase difference.

The DLL may be one of multiple DLLs on the chip. The clock generator may be further configured to source the DLL input clock to the multiple DLLs.

The fixed delay line path may include a fixed delay line circuit and a first clock distribution circuit. The variable delay line path may include a variable delay line circuit and a second clock distribution circuit. The first insertion delay may be a first fixed delay and may be configured to cause latency of the DLL input clock from the clock generator. The first insertion delay may be a first aggregation of respective fixed delays of the fixed delay line and first clock distribution circuits. The second insertion delay may be variable and configured to cause latency of the DLL input clock from the clock generator. The second insertion delay may be a second aggregation of a controllable variable delay of the variable delay line circuit and a second fixed delay of the second clock distribution circuit.

The chip may include a DVFS controller coupled to the clock generator. The clock generator may be further configured to source the DLL input clock, following release of the chip from reset, at the run-time frequency specified by the DVFS controller. The second insertion delay is caused to match the first insertion delay with the DLL locked at each frequency specified for the run-time frequency by the DVFS controller.

According to another example embodiment, a method for dynamic voltage frequency scaling (DVFS) on a chip for dynamic voltage frequency scaling (DVFS) on a chip may comprise sourcing a delay-locked loop (DLL) input clock to a DLL, at a start-up frequency prior to a run-time frequency. The start-up frequency may be lower relative to a target frequency for the chip. The run-time frequency may be configured based on DVFS, following release of the chip from reset. The DLL input clock may be sourced (i) to a fixed delay line path with a first insertion delay and (ii) to a variable delay line path with a second insertion delay. The method may comprise releasing the chip from reset with the DLL locked at the start-up frequency, enabling the second insertion delay to match the first insertion delay with the DLL locked at the start-up frequency.

Alternative method embodiments parallel those described above in connection with the example circuit embodiments.

It should be understood that example embodiments disclosed herein can be implemented in the form of a method, apparatus, system, or computer readable medium with program codes embodied thereon.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

Figure 1A:
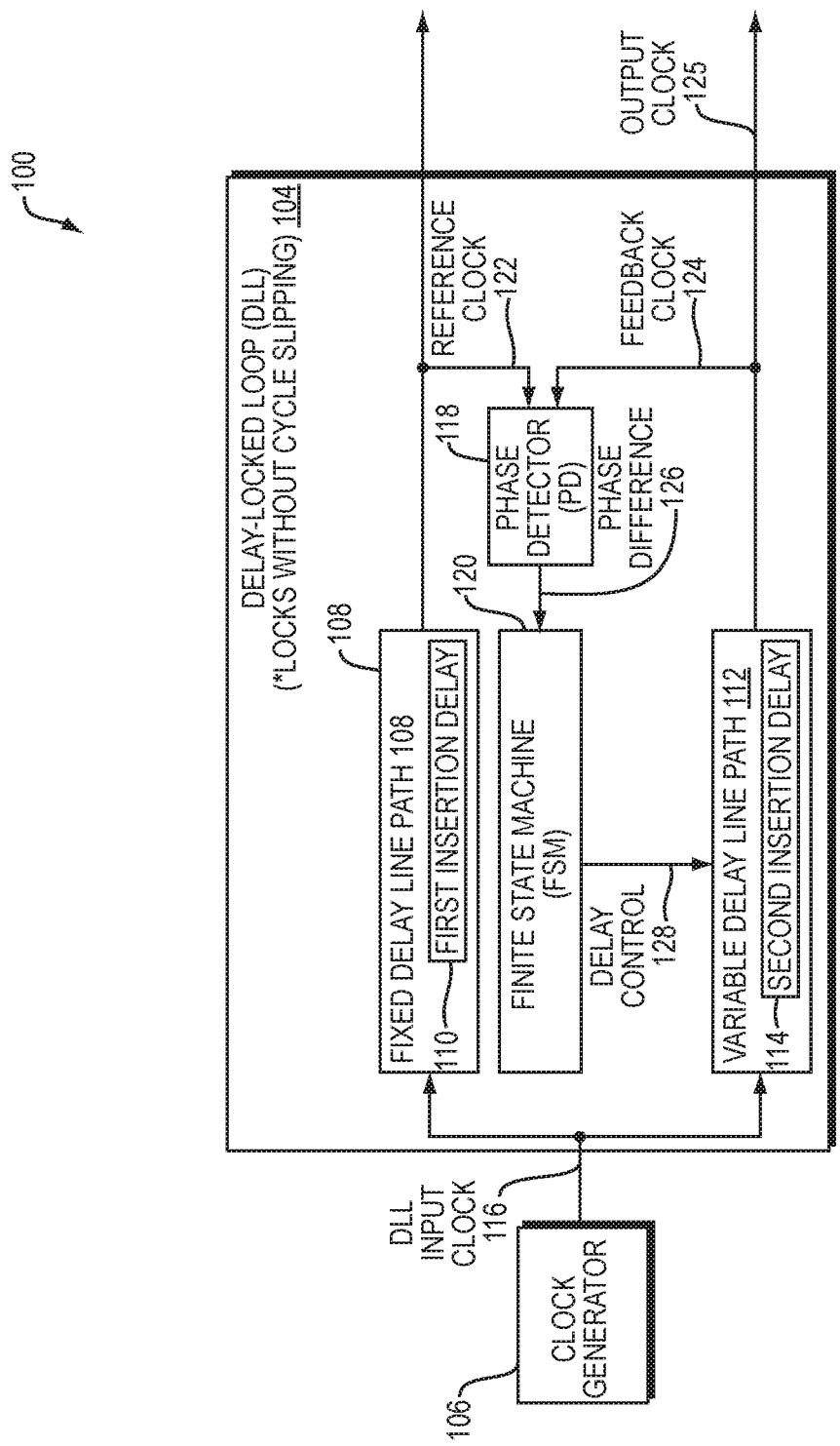
FIG. 1A is a block diagram of an example embodiment of a circuit for dynamic voltage frequency scaling (DVFS) on a chip.

A description of example embodiments follows.

Hardware components, such as processors, may dynamically alter their frequency to balance performance and power consumption. Running at a lower frequency may reduce power consumption at a cost to performance, while running at a higher frequency may increase performance but consume more power. The ability to dynamically scale processor clock frequency and power supply voltage with workload is a useful technique for reducing active and standby power consumption, such as in nanoscale embedded systems and other applications. This dynamic adjustment is commonly known as Dynamic Voltage Frequency Scaling (DVFS).

DVFS has been used successfully to reduce power in many applications, such as portable embedded applications (e.g., PDAs and cell phones) and other applications. DVFS circuits may be implemented with a phase-lock loop (PLL) that may be used to multiply a low frequency reference signal that is typically derived from an external crystal oscillator to generate as a processor clock frequency. A PLL prescaler can be changed to generate a new clock frequency to dynamical scale the processor clock frequency. Even relatively fast-locking PLLs may incur a delay on the order of microseconds to regain lock after the PLL prescaler has been changed and during such time that the processor clock frequency (i.e., the system clock) may be unstable, translating in missed central processing unit (CPU) cycles.

To avoid stopping the processor, one method that may be employed by DVFS to scale the frequency is a dual-PLL architecture that uses one PLL to drive the system clock while the second PLL is locking to a different frequency. Once the second PLL is locked to the new frequency, the system clock can be switched to the second PLL.

A DLL-based clocking architecture may be used to phase-match two or more clocks that are logically the same but physically different. When used together (e.g., dual-PLL+DLL architecture), an excessive insertion delay difference between the two or more clocks can cause a chip to malfunction due to a cycle slip.

For example, if an insertion delay mismatch between two clocks is greater than a phase of a reference clock, the delayed clock could lock to a next or previous cycle of the reference clock. This cycle slip can be unacceptable for clock coherency. For example, during the PLL-switch, disclosed above, a glitch-free operation depends on one or more dead cycles. If one clock stops one cycle earlier or later than the other clock, the logical state could be unpredictable or even illegal in some cases, potentially causing the chip to malfunction.

According to an example embodiment, a dual-PLL and DLL-based clock architecture eliminates the cycle slip issue by locking the DLLs at low-frequency, that is, a frequency that is lower relative to a target frequency. The target frequency may be for operating the chip at "full-speed." In a stage for which the chip is configured to come out of reset, the dual-PLLs may be programmed to be at the low-frequency first and the DLL(s) locked. This ensures that the insertion delay mismatches between the two clocks are a small fraction of the clock cycle. Once the DLL(s) are locked to the reference clock, the frequency may be increased in small increments until full-speed is reached. This gradual increase ensures that the clocks remain aligned to the same edge of the reference clock. According to an example embodiment, during DVFS, the voltage and frequency may be adjusted in small increments to keep the clocks aligned to the same edge of the reference clock.

FIG. 1A is a block diagram of an example embodiment of a circuit 100 for dynamic voltage frequency scaling (DVFS) on a chip (not shown). The circuit 100 comprises a delay-locked loop (DLL) 104 and a clock generator 106. The clock generator 106 is configured to source a DLL input clock 116. According to an example embodiment, a frequency of the DLL input clock 116 may be changed for a DVFS application and insertion delays of the DLL input clock 116 may be advantageously matched, independent of such changes. For example, insertion delays of the DLL input clock 116 to travel from the clock generator 106 to respective inputs of a phase detector 118 of the DLL 104 may be advantageously matched, independent of such changes. According to an example embodiment, such insertion delays, that is, a first insertion delay 110 and a second insertion delay 114 are advantageously matched for any given frequency of the DLL input clock 116 and as such, the DLL 104 is suitable for use in the DVFS application, as disclosed further below with regard to FIG. 1B.

In any semiconductor chip, there is a need for clocks that are phase-locked to reference clocks, such as the output clock 125 (also referred to interchangeably herein as a feedback clock 124) that is phase-locked to a reference clock 122. Such phase-locking is accomplished via the DLL 104 that includes a phase detector 118 configured to compare phases of the feedback clock 124 and reference clock 122 and generate a phase difference 126 as a function of the comparison. The phase difference 126 is used by a finite state machine (FSM) 120 of the DLL 104 to control a variable delay (not shown) of a variable delay line path 112.

The DLL 104 is a control loop and adjusts the variable delay, such as the variable delay of the variable delay element 144, disclosed further below with regard to FIG. 1B, based on the phase difference 126. The variable delay is controlled by the FSM 120 via the delay control 128 to cause the output clock 125 and reference clock 122 to have a same phase. Both clocks, that is, both the reference clock 122 and the output clock 125, are sourced by the clock generator 106. More specifically, the clock generator 106 sources the DLL input clock 116 and the DLL input clock 116 sources both the reference clock 122 and the output clock 125. The reference clock 122 and output clock 125 have a same frequency as that of the DLL input clock 116 that is sourced to the DLL 104.

The DLL input clock 116 may be a phase-locked clock that is sourced by the clock generator 106 via a single source, such as a single PLL, or via multiple multiplexed sources, such the PLL0 130a and PLL1 130b of FIG. 1B, disclosed further below. Multiple PLLs, such as the PLL0 130a and the PLL1 130b, may be multiplexed by a multiplexer 132, as disclosed in FIG. 1B.

The reference clock 122 and the output clock 125, both sourced by the DLL input clock 116, reach respective inputs of the phase detector 118 via a fixed delay line path 112 and variable delay line path 108, respectively. Source latency, that is, a transfer time (i.e., time delay) for the DLL input clock 116 to be transferred (i.e., travel) from the clock generator 106 to the reference clock 122, may be referred to herein as a first insertion delay. A transfer time for the DLL input clock 116 to be transferred from the clock generator 106 to the output clock 125 (i.e., the feedback clock 124) may be referred to herein as a second insertion delay. Such insertion delays may also be referred to interchangeably herein as source insertion delays. According to an example embodiment, the fixed delay line path 108 has a first insertion delay 118 and such delay is fixed, that is, static, whereas the variable line delay path 112 has a second insertion delay 114 and such delay is variable, that is dynamic.

Matching of such insertion delays with one another is a sufficient but not necessary condition for the DLL 104 to achieve phase lock. This condition, that is, matching of such insertion delays, may not happen if a clock period T of the sourced DLL input clock 116 is small compared to the variable delay of the variable delay element 144 and delays of the FSM 120 and phase detector 118, as disclosed below with regard to FIG. 1B.

Figure 1B:
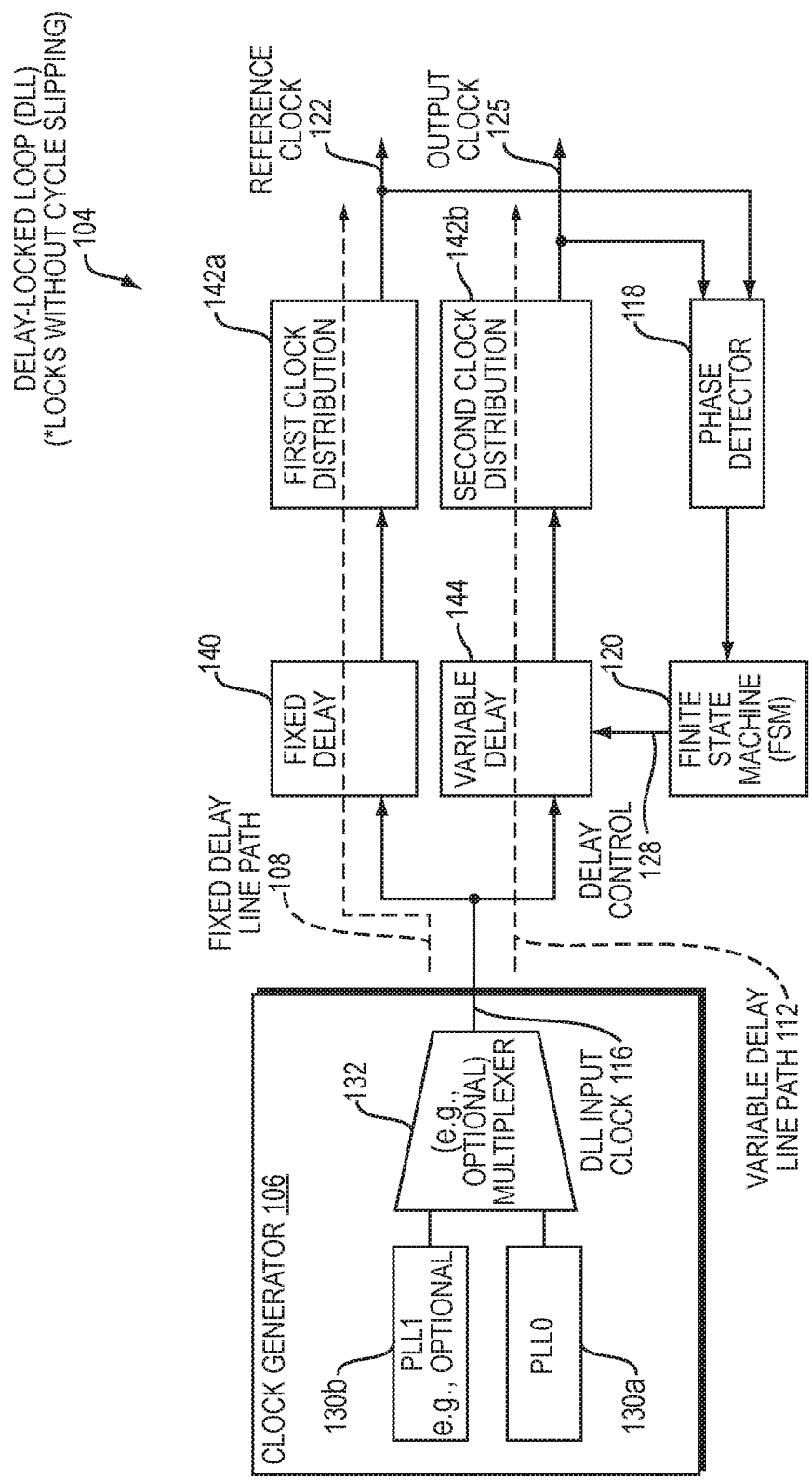
FIG. 1B is a block diagram of an example embodiment of the circuit of FIG. 1A.

FIG. 1B is a block diagram of an example embodiment of the circuit 100 of FIG. 1A. As disclosed above with regard to FIG. 1A, the reference clock 122 and the output clock 125 are both sourced by the DLL input clock 116 and reach respective inputs of the phase detector 118 via the fixed delay line path 112 and the variable delay line path 108, respectively. The fixed delay line path 112 includes a fixed delay element 140 and first clock distribution 142a. The fixed delay line path 108 has a first insertion delay (not shown) that is fixed. The first insertion delay includes fixed delays, exclusively, and the fixed delays include fixed delays of the fixed delay element 140 and a first clock distribution 142a. The first clock distribution 142a may be referred to interchangeably herein as a reference clock distribution. The variable delay line path 112 has a second insertion delay (not shown) that is variable. The second insertion delay includes both variable and fixed delays and, thus, is variable.

The second insertion delay includes a variable delay of the variable delay element 144 and a fixed delay of a second clock distribution 142b. As disclosed above, matching the first and second insertion delays is a sufficient but not necessary condition for the DLL 104 to achieve phase lock. Matching of the second insertion delay to the first insertion delay, that is: [delay(variable delay element 144)+delay (second clock distribution 142b)]=[delay(fixed delay element 140)+delay(first clock distribution 142a), may not happen if the clock period T of the sourced DLL input clock 116 is small compared to the variable delay of the variable delay element 144, and delays of the FSM 120 and phase detector 118.

For example, an alternative lock condition may happen with: [delay(variable delay element 144)+delay(second clock distribution 142b)]=[delay(fixed delay element 140)+ delay(first clock distribution 142a)+/−nT, where n is an integer. Such an alternative lock condition, that is, a lock condition with +/−nT, may be acceptable, in general, but won't work in a DVFS system for at least two reasons.

First, the voltage will vary. Delays of the variable delay element 144, FSM 120, and phase detector 118 are inversely proportional to voltage (first order). As such, if an additional nT delay is contained in either the [delay(fixed delay element 140)+delay(first clock distribution 142a)] or in [delay (variable delay element 144)+delay(second clock distribution 142b)], then the additional nT delay will cause delay differences between the two clock branches (i.e., paths) at different voltages and will most likely cause the variable delay to run out of range and to not achieve phase lock. This is because DLLs are simple systems and can only operate on clock edges within half a period of each other.

A second reason for why the alternative lock condition is not acceptable for a DVFS system is that, in the DVFS system, the frequency of the clock source changes to produce different frequencies. In this case, if the respective delays from the source (i.e., the DLL input clock 116) to its leaf clocks (i.e., the reference clock 122 and the output clock 125), that is, the first and second insertion delays, are not matched, then edges defining inconsistent clock periods will show up at the reference clock 122 and the output clock 125, causing catastrophic system failure.

To avoid the alternative lock condition disclosed above, an example embodiment may engage the PLL0 130a to source the DLL input clock 116 at a start-up frequency that is "low," namely, the DLL input clock 116 is sourced with a period $T_{start-up}$>=max {[delay(fixed delay element 140)+ delay(first clock distribution 142a)], [delay(variable delay element 144)+delay(second clock distribution 142b)]} when the chip is released from reset, where the start-up frequency is f=1/T$_{start-up}$. Programming the PLL0 130a to source the DLL input clock 116 at such a start-up frequency and releasing the chip from reset with the DLL 104 locked at the start-up frequency guarantees locking at the same insertion delay from the clock generator 106 sourcing the DLL input clock 116 to all leaf clocks, that is, to the reference clock 122 and output clock 125, and, thus, enables DVFS to be functional.

Subsequently, PLL1 103b may be engaged, that is, a phase-locked clock of the PLL1 130b may be multiplexed in by the multiplexer 132 to source the DLL input clock 116 at a faster (i.e., higher) frequency relative to the start-up frequency to bring the system to a desired (i.e., target) speed. Alternatively, a single PLL, such as the PLL0 130a may be employed to ramp up a frequency of the DLL input clock 116 to a target frequency as the PLL1 103b and the multiplexer 132 are optional.

As such, in the example embodiment of FIG. 1B, the alternative lock condition disclosed above is avoided and the DLL 104 is configured to lock with [delay(variable delay element 144)+delay(second clock distribution 142b)]=[delay(fixed delay element 140)+delay(first clock distribution 142a), also referred to interchangeably herein as locking without cycle slipping, because n in nT is zero and denotes a number of cycle slips. Such locking of the DLL 104 without cycle slipping is ensured by matching the second insertion delay to the first insertion delay, as disclosed above and below with regard to FIG. 1A.

Referring back to FIG. 1A, the DLL 104 includes a fixed delay line path 108 with a first insertion delay 110 and a variable delay line path 112 with a second insertion delay 114. The clock generator 106 is configured to source a DLL input clock 116 to the fixed delay line path 108 and the variable delay line path 112 at a start-up frequency prior to a run-time frequency. The start-up frequency is lower relative to a target frequency for the chip. The run-time frequency is may be configured based on DVFS, following release of the chip from reset. The chip is configured to be released from reset with the DLL 104 locked at the start-up frequency, enabling the second insertion delay 114 to match the first insertion delay 110 with the DLL 104 locked at the start-up frequency. Configuring the chip to be released from reset with the DLL 104 locked at the start-up frequency, avoids the alternative lock condition, disclosed above with regard to FIG. 1B, and enables the DLL 104 to be used in a DVFS system.

Employing such a start-up frequency, in the manner disclosed herein, ensures that the second insertion delay 114 matches the first insertion delay 110 with the DLL 104 locked at the start-up frequency as well as at any other frequencies configured for the run-time frequency, including frequencies that are higher relative to the start-up frequency, such as the target frequency. According to the example embodiment, such a start-up phase for the chip that includes releasing the chip 100 from reset with the DLL 104 locked at the start-up frequency, causes the first insertion delay 110 and the second insertion delay 114 to be advantageously matched for any given frequency of the DLL input clock 116. Thus, the DLL 104 can be employed advantageously in a DVFS system because the DLL 104, configured as disclosed herein, provides identical insertion delays to each clock from the source.

As such, the DLL 104 locks without cycle slipping with the DLL 104 locked at a fast clock, that is, a clock that is higher in frequency relative to the start-up frequency. Locking is accomplished without cycle slipping because the second insertion delay 114 is equivalent to the first insertion delay 110, as opposed to being +/−n*T relative to the first insertion delay 110, where n is an integer and T is a clock period of the reference clock 122, that is, a clock period of the DLL input clock 116. According to an example embodiment, the start-up frequency may be 500 MHz and the target frequency may be 2.5 GHz; however, it should be understood that the start-up frequency and target frequency may be any suitable frequencies for which the start-up frequency is lower relative to the target frequency.

According to an example embodiment, the start-up frequency may be determined based on a statistical, simulated, or theoretical, maximum process phase error Δt, where the maximum process phase error Δt is a maximum phase difference in time between the reference clock 122 and the feedback clock 124, that is, the output clock 125. The start-up frequency $f_{min}=1/(2*t_{phase})$, where $1/(2*t_{phase})$ is less than $1/(2*\Delta t)$.

According to an example embodiment, the DLL 104 may be one of multiple DLLs on the chip. The clock generator 116 may be further configured to source the DLL input clock 116 to the multiple DLLs in the manner disclosed with regard to DLL 104 and, as such, the multiple DLLs also lock without cycle slipping. According to an example embodiment, the chip may include multiple circuits each mirroring the circuit 100. The chip may be a multi-core processor that includes multiple processor cores. Respective output clocks from DLLs of the multiple circuits may be employed as respective clocks of the multiple processor cores of the multi-core processor.

The clock generator 106 may be further configured to increase frequency of the DLL input clock 116 from the start-up frequency to the target frequency after release of the chip from reset. According to an example embodiment, the clock generator 106 may be further configured to increase the frequency of the DLL input clock 116, gradually, from the start-up frequency to the target frequency, the target frequency higher relative to the start-up frequency. The second insertion delay is matched with the first insertion delay with the DLL 104 locked at the target frequency. Alternatively, the increase in frequency from the start-up frequency may not be gradual and such increase may be from the start-up frequency directly to the target frequency. Frequency of the DLL input clock 116 after release of the chip from reset may be referred to interchangeable herein as a run-time frequency.

Such an increase of the run-time frequency of the DLL input clock 116 may be "gradual" as the frequency does not transition directly from the start-up frequency to the target frequency. Rather, the DLL input clock 116 may be sourced at one or more intermediate frequencies between the start-up frequency and the target frequency, the one or more intermediate frequencies are higher than the start-up frequency and lower than the target frequency. The DLL input clock 116 may be sourced at the start-up frequency and the one or more intermediate frequencies with a dwell time. The dwell time may be configured to enable the DLL 104 to lock at a given frequency before the clock generator 106 is configured to change the given frequency.

According to an example embodiment, the DLL 104 may further include a phase detector 118 and a finite state machine (FSM) 120. The phase detector 118 may be coupled to the fixed delay line path 108, variable delay line path 112, and the FSM 120. The circuit 100 may be configured to input the DLL input clock 116 (also referred to interchangeably herein as a PRECLK) to the fixed delay line path 108 and the variable delay line path 112. The fixed delay line path 108 may be configured to output a reference clock 122 (also referred to interchangeably herein as a REFCLK) to the phase detector 118. The variable delay line path 112 may be configured to output a feedback clock 124 to the phase detector 118.

The variable delay line path 112 may be a voltage controlled delay line path. The DLL input clock 116 (also referred to interchangeably herein as PRECLK or input reference clock) drives the variable delay line path which may include a variable delay line circuit with a number of cascaded delay buffers. The output clock from the variable delay line path, that is, the feedback clock 124, drives the phase detector 118 to generate a loop control voltage, that is, the phase difference 126. The output of the phase detector, that is, the phase difference 126, may be integrated by a charge pump (not shown) and a loop filter capacitor (not shown). The loop negative feedback drives the FSM 120 to drive a delay control 128, that is, a control voltage, to a value that forces a zero-phase error between the output clock, that is, the feedback clock 124, and the reference clock 122. As such, the FSM 120 is configured to move a phase of the feedback clock 124 according to the phase detector 118 output, that is, according to the phase difference 126.

The feedback clock 124 may be output as an output clock for use in the chip. For example, according to an example embodiment, the output clock 125, that is, the feedback clock 124, may be used for clocking one or more processor cores on the chip, or may be employed in any other suitable manner on the chip. According to an example embodiment, the circuit 100 may be internal to the chip. Alternatively, the circuit 100 may be external to the chip and configured to source the output clock 125 to the chip.

The phase detector 118 may be configured to generate the phase difference 126 based on a comparison of respective phases of the reference clock 122 and feedback clock 124. The FSM 120 may be configured to control delay of the variable delay line path 112 via the delay control 128 that is a function of the phase difference 126. The FSM 120 may be configured to set the delay control 128 to bring the feedback clock 124 into phase alignment with the reference clock 122. The delay control 128 may be a voltage that is generated by the FSM 120 as a function of the phase difference 118 and the variable delay 144 may be a voltage-controlled variable delay.

The circuit 100 may further comprise a reset sequence circuit (not shown) that is configured to release the DLL 104 and chip from reset, sequentially, by releasing the DLL 104 from reset prior to releasing the chip from reset, as disclosed further below with regard to FIG. 3. As disclosed with regard to FIG. 3, further below, the reset sequence circuit may be further configured to release the DLL 104 and chip from reset, sequentially, in response to an indication that power of the chip is stable. According to an example embodiment, the clock generator 106 may be further configured to source the DLL input clock 116 at the start-up frequency in response to the indication that power of the chip is stable. The indication that power is stable may be generated by a power supervisor circuit (not shown) that is external to the chip and populated on a printed circuit board (not shown).

The DLL 104 may be configured to lock, initially, at the start-up frequency, following release of the DLL 104 from reset and prior to release of the chip from reset, as disclosed further below with regard to FIG. 3.

According to an example embodiment, the chip 100 may include a DVFS controller (not shown) coupled to the clock generator 106. The DVFS controller may be any suitable DVFS mechanism that is configured to control frequency of the DLL input clock 116 and voltage of the chip 100, at run-time, that is, after release of the chip 100 from reset, depending on load of the chip. DVFS is a common technique for managing power, as disclosed above. The DVFS controller may be configured to optimize power-performance by changing both frequency and voltage of the chip 100 at run-time. The DVFS controller may be implemented in hardware or as a combination or hardware and software. As disclosed herein, an example embodiment causes insertion delays to match and, thus, enables the DLL 104 to be employed in a DVFS system.

According to an example embodiment, the clock generator 106 may be further configured to source the DLL input clock 116, after release of the chip from reset, at run-time frequencies specified by the DVFS controller, the second insertion delay 114 caused to match the first insertion delay 110 with the DLL locked at each of the specified run-time frequencies. According to an example embodiment, the DVFS controller may be configured to program one or more phase-locked loops at a specified run-time frequency and cause the DLL input clock 116 to be phase-locked at the specified run-time frequency. For example, the DVFS controller may be configured to program the PLL0 232a and, optionally, the PLL1 232b, and to control a clock selector, to cause the clock generator 106 to source the input DLL clock 116 at the specified run-time frequency, as disclosed below.

According to an example embodiment, the DLL input clock 116 may be a phase-locked clock and the clock generator 106 may include multiple phase-locked loops (PLLs) and a clock selector in order to source the DLL input clock 116, as disclosed below with regard to FIG. 2.

Figure 2:
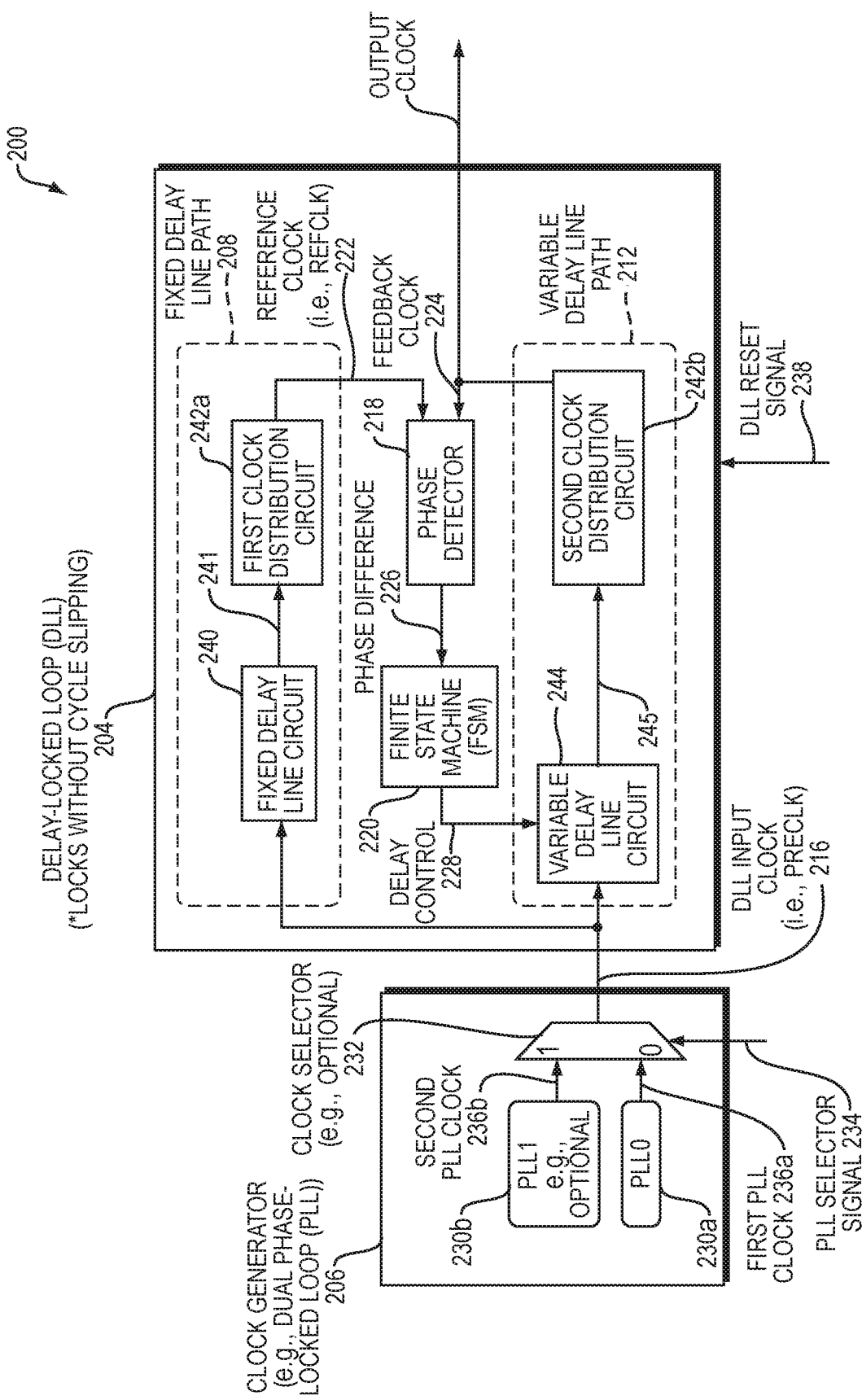
FIG. 2 is a block diagram of another example embodiment of the circuit of FIG. 1A.

FIG. 2 is a block diagram of an example embodiment of a circuit 200 that may be employed as the circuit 100 of FIG. 1A, disclosed above, for DVFS on a chip (not shown). The circuit 200 comprises a DLL 204 and a clock generator 206. The DLL 204 includes a fixed delay line path 208, with a first insertion delay, and a variable delay line path 212, with a variable delay. The clock generator 206 is configured to source a DLL input clock 216 to the fixed delay line path 208 and the variable delay line path 212 at a start-up frequency prior to a run-time frequency. The start-up frequency is lower relative to a target frequency for the chip. The run-time frequency may be configured based on DVFS, following release of the chip from reset. The chip is configured to be released from reset with the DLL 204 locked at the start-up frequency, enabling the second insertion delay to match the first insertion delay with the DLL 204 locked at the start-up frequency. Since the second insertion delay is matched with the first insertion delay, the DLL 204 avoids the alternative lock condition, disclosed above, and locks without cycle slipping.

The clock generator 206 may include multiple phase-locked loops (PLLs), such as a first phase-locked loop (PLL) 230a and a second PLL 230b, and a clock selector 232. According to an example embodiment, the clock generator 206 may be a dual-PLL. Alternatively, the clock generator 206 may include any suitable number of PLLs, wherein a lowest frequency employed for programming any one of the multiple PLLs is the start-up frequency and a highest frequency employed is the target frequency.

The clock selector 206 is configured to select a given PLL of the multiple PLLs, that is, a given PLL of the first PLL 230a (also referred to interchangeably herein as PLL0) and second PLL 230b (also referred to interchangeably herein as PLL1) in the example embodiment, to source the DLL input clock 216 at the start-up frequency, wherein the given PLL is programmed at the start-up frequency.

According to an example embodiment, the clock selector 232 may be a multiplexer; however, the clock selector 232 may be any suitable circuit configured to select a given PLL from among multiple PLLs as a function of at least one PLL selector signal 234. The at least one PLL selector signal 234 may be controlled by the reset sequence circuit (not shown). It should be understood that selecting the given PLL causes a phase-locked clock generated by the given PLL to be sourced as the DLL input clock 216. For example, in the example embodiment, selecting a given PLL of the first PLL 230a and second PLL 230b causes the DLL input clock 216 to be sourced as either the first PLL clock 236a or the second PLL clock 236b, as a function of selecting the first PLL 230a or the second PLL 230b, respectively.

The clock selector 232 may be further configured to select the given PLL, programmed at the start-up frequency, in response to an indication that power of the chip is stable. For example, in the example embodiment, in response to an indication that power of the chip is stable, the at least one PLL selector signal 234 may be configured to select either the first PLL clock 236a or the second PLL clock 236b to be sourced as the DLL input clock 216 based on which of the two is operating at the start-up frequency. The DLL 204 may be configured to lock, initially, at the start-up frequency, following release of the DLL 204 from reset and prior to release of the chip from reset, as disclosed further below with regard to FIG. 3.

The clock selector 232 may be further configured to select a different PLL from the multiple PLLs via configuration of the at least one PLL selector signal 234 to source the DLL input clock 216 at a higher frequency following release of the chip from reset, as disclosed further below with regard to FIG. 3. The higher frequency may be higher relative to the start-up frequency. The different PLL may be different from the given PLL that had been selected to source the DLL input clock 216 at the start-up frequency.

The DLL 204 further includes a phase detector 218 and an FSM 220. The DLL 204 may be configured to be released from reset via release of the FSM 220 from reset. The FSM 220 may be configured to be released from reset via a DLL reset signal 238 in response to an indication that power of the chip is stable and prior to release of the chip from reset, as disclosed further below with regard to FIG. 3. According to an example embodiment, the DLL reset signal 238 may be a delayed version of a power stable signal, such as a delayed version of the power stable signal 354 of FIG. 3, disclosed below. The delayed version may be delayed by a fixed amount of time and such a delayed version may also be employed to control the PLL selector signal 234 to cause the clock selector 232 to multiplex in the PLL clock, that is the first PLL clock 236a or second PLL clock 236b, that is programmed at the start-up frequency.

The phase detector 218 is coupled to the fixed delay line path 208, variable delay line path 212, and the FSM 220. The circuit 200 is configured to input the DLL input clock 216 (i.e., PRECLK) to the fixed delay line path 208 and the variable delay line path 212. The fixed delay line path 208 is configured to output a reference clock 222 (i.e., REFCLK) to the phase detector 218. The variable delay line path 212 is configured to output a feedback clock 224 to the phase detector 218. The feedback clock 224 may be output as an output clock for use in the chip, as disclosed above with regard to FIG. 1A.

The phase detector 218 is configured to generate a phase difference 226 based on a comparison of respective phases of the reference clock 222 and feedback clock 224. The FSM 220 is configured to control delay of the variable delay line path 212 via a delay control 228 that is a function of the phase difference 226. For example, the feedback clock 224 may drive the phase detector 218 to generate a loop control voltage, that is, the phase difference 226, causing the FSM 220 to drive the delay control 228 to a value that forces a zero-phase error the feedback clock 224 and the reference clock 222. As such, the FSM 220 is configured to move a phase of the feedback clock 224 according to the phase detector 218 output, that is, according to the phase difference 226.

The circuit 200 may further comprise a reset sequence circuit (not shown) that is configured to release the DLL 204 and chip from reset, sequentially, by releasing the DLL 204 from reset prior to releasing the chip from reset, as disclosed with regard to FIG. 3, further below. As disclosed in FIG. 3, further below, the reset sequence circuit may be further configured to release the DLL 204 and chip from reset, sequentially, in response to an indication that power of the chip is stable. According to an example embodiment, the clock generator 206 may be further configured to source the DLL input clock 216 at the start-up frequency in response to the indication that power of the chip is stable.

The fixed delay line path 208 includes a fixed delay line circuit 240 and first clock distribution circuit 242a. The first clock distribution circuit 242a is interposed between the fixed delay line circuit 240 and the phase detector 218. The first insertion delay of the fixed delay line path 208 is a fixed delay includes a fixed circuit delay of the fixed delay line circuit 240 and a first fixed clock distribution delay of the first clock distribution circuit 242a. According to an example embodiment, the DLL input clock 116 at the start-up frequency is sourced with a period>=max {[delay (fixed delay line circuit 240)+delay(first clock distribution 242a)], [delay(variable delay line circuit 244)+delay(second clock distribution 242b)]}.

The fixed delay line circuit 240 may be any suitable delay line circuit with a fixed delay. For example, the fixed delay line circuit 240 may include a delay chain that includes multiple delay gates, such as buffers or any other suitable delay element, connected output-to-input, that is, cascaded.

The variable delay line path 212 includes a variable delay line circuit 244 and a second clock distribution circuit 242b. The second clock distribution circuit 242b is interposed between the variable delay line circuit 244 and the phase detector 218. The second insertion delay of the variable delay line path 212 is variable and includes a variable circuit delay of the variable delay line circuit 244 and a second fixed clock distribution delay of the second clock distribution circuit 242b.

The first insertion delay, such as the first insertion delay 110 of FIG. 1A, disclosed above, may be a first fixed delay and may be configured to cause latency of the DLL input clock 216 from the clock generator 206. The first insertion delay may be a first aggregation of respective fixed delays of the fixed delay line circuit 240 and the first clock distribution circuit 242a. The second insertion delay, such as the second insertion delay 114 of FIG. 1A, may be variable and may be configured to cause latency of the DLL input clock 216 from the clock generator 206. The second insertion delay may be a second aggregation of a controllable variable delay of the variable delay line circuit 244 and a second fixed delay (also referred to interchangeably herein as a second fixed clock distribution delay) of the second clock distribution circuit 242b. The controllable variable delay of the variable delay line circuit 244 is controlled by the FSM 220.

The second fixed clock distribution delay may match the first fixed clock distribution delay, substantially. For example, the second clock distribution circuit 242b may mirror the first clock distribution circuit 242a and, as such, fixed delays of such mirrored circuits may match one another, substantially, within a tolerance, such as +/−0.1%, +/−0.5%, +/−1%, or within any other suitable tolerance that enables clock slip to be avoided. The FSM 220 controls delay of the variable delay line path 212 by controlling the variable circuit delay of the variable delay line circuit 244 as a function of the phase difference 226. The variable delay line circuit 244 may be voltage-controlled delay line with multiple taps for bringing the feedback clock 224 into phase alignment with the reference clock 222 and the delay control 228 may be voltage that is generated by the FSM 220 as a function of the phase difference 218.

According to an example embodiment, the first clock distribution circuit 242a and second clock distribution circuit 242b are clock trees. The fixed delay line circuit 240 drives a first root clock 241 into the first clock distribution circuit 242a and the variable delay line circuit 244 drives a second root clock 245 into the second clock distribution circuit 242b. The reference clock 222 and feedback clock 224 may be referred to interchangeably herein as leaf clocks of the first clock distribution circuit 242a and second clock distribution circuit 242b, respectively.

Figure 3:
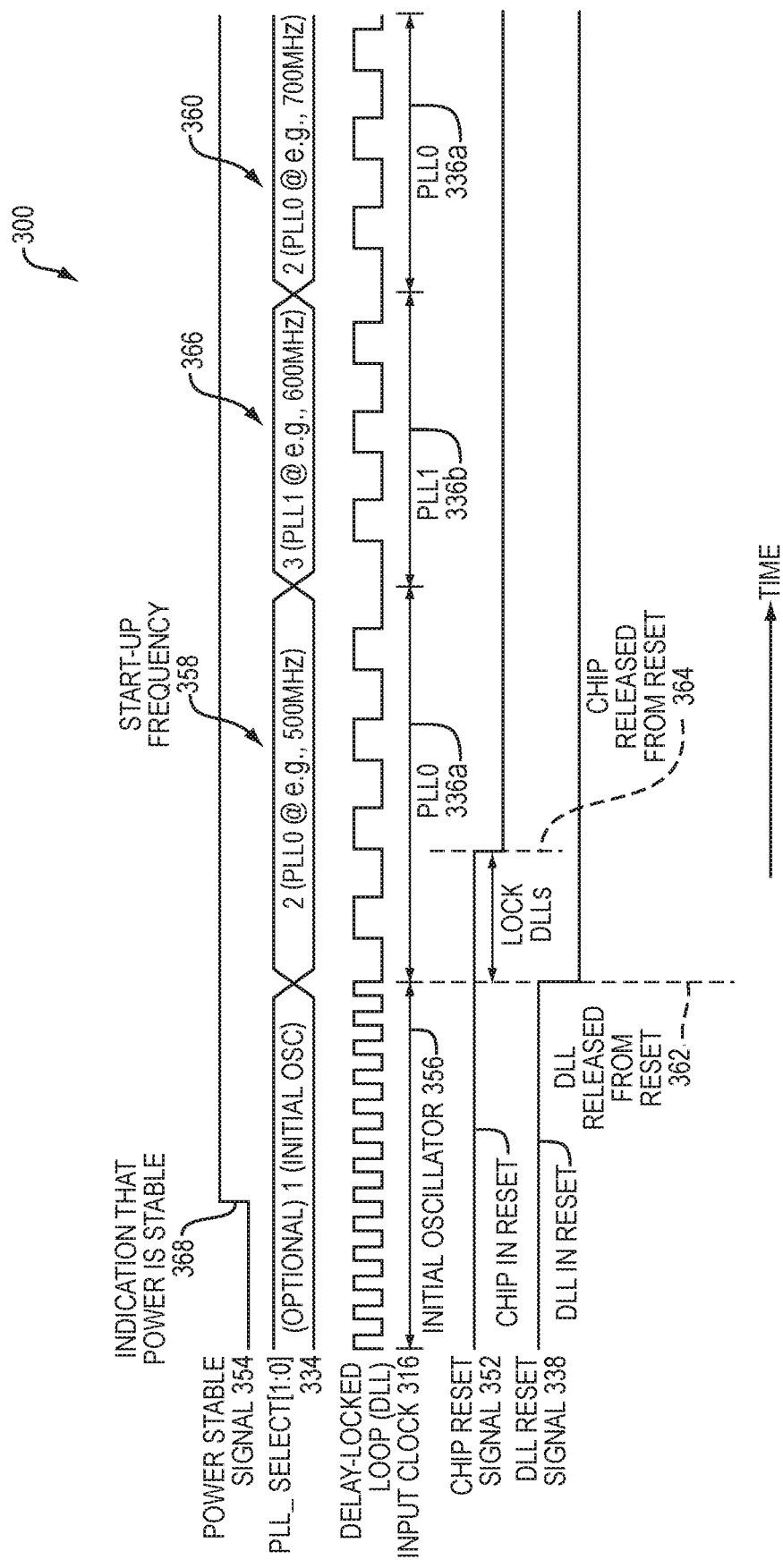
FIG. 3 is a timing diagram of an example embodiment of a set of signals that may be employed in the circuit of FIG. 2.

FIG. 3 is a timing diagram 300 of an example embodiment of a set of signals that may be employed in the circuit 200 of FIG. 2, disclosed above. The set of signals includes, a power stable signal 354 (also referred to interchangeably herein as Power_Stable), at least one PLL select signal 334 (i.e., PLL select[1:0]), a DLL input clock signal 316, chip reset signal 352, and DLL reset signal 338. The at least one PLL select signal 334, chip reset signal 352, and DLL reset signal 338 may be generated by a reset sequence circuit, disclosed above, and the power stable signal 354 may be generated by a power supervisor, disclosed above.

At power-up of the chip, the chip reset signal 352 and DLL reset signal 338 are configured to be asserted, that is, to hold the DLL 204 and as well as the chip, in reset. The DLL reset signal 338 may hold the DLL 204 in reset by holding the FSM 220 in reset, as disclosed above.

According to an example embodiment, the DLL reset signal 338 may be a delayed version of the power stable signal 354 that is delayed by a fixed amount of time. Such a delayed version of the power stable signal 354 may also be employed to cause the PLL selector signal 334 to multiplex in the PLL clock with start-up frequency 358. The chip reset signal 352 may be a delayed version of the chip reset signal 352, that is, a further delayed version of the power stable signal that is delayed by the fixed amount of time and an additional amount of time that enables the DLL 204 to lock at the start-up frequency 358.

The at least one PLL select signal 334 (i.e., PLL_select[1:0]) includes two signals in the example embodiment, enabling an additional clock input, that is, an initial oscillator 356 to be selected (i.e., multiplexed) by the clock selector 232 in addition to the first PLL clock 336a of PLL0 and the second PLL clock 336b of PLL1. According to an example embodiment, the initial oscillator 356 may be selected prior to release of the DLL 204 from reset. Alternatively, the PLL select signal 334 may be a single signal that selects between PLL0 and PLL1 and selects either PLL0 or PLL1 prior to release of the DLL 204 from reset.

As disclosed in the timing diagram 300, the PLL select signal 334 (i.e., PLL_select[1:0]) is configured such that the DLL input clock 316 is sourced to the fixed delay line path 208 and variable delay line path 212 at a start-up frequency 358 prior to a higher frequency, such as the first higher frequency 366 and the second higher frequency 360. The chip may be configured to be released from reset 364 via the chip reset signal 352 with the DLL 204 locked at the start-up frequency 358, enabling the second insertion delay to match the first insertion delay with the DLL locked at the first higher frequency 366 and the second higher frequency 360.

The PLL select signal 334 (i.e., PLL_select[1:0]) is further configured such that frequency of the DLL input clock 316 is increased from the start-up frequency 358 to the target frequency, that may be the second higher frequency 360, or any other suitable frequency higher than the start-up frequency 358, after release of the chip from reset, that is, after the DLL is released from reset 362.

It should be understood that the frequencies of the start-up frequency 358, first higher frequency 366, and second higher frequency 360, disclosed in FIG. 3 are for illustrative purposes and that any suitable frequencies may be employed. Further, it should be understood that the timing diagram 300 may continue in time, with PLL select signal 334 (i.e., PLL_select[1:0]) configured in a manner that continues to alternate between selection of PLL0 and PLL1 until the target frequency is reached.

The frequency of the DLL input clock 316 may be increased, gradually, from the start-up frequency 358 to the target frequency, the target frequency higher relative to at least one intermediate frequency, such as the first higher frequency 366 and second higher frequency 360, the second insertion delay matched with the first insertion delay with the DLL 204 locked at the target frequency.

As disclosed above with regard to FIG. 2, the DLL 204 and chip may be released from reset, sequentially, by releasing the DLL 204 from reset prior to releasing the chip from reset. As disclosed in the timing diagram 300 of FIG. 3, the DLL is released from reset 362 prior to the chip being released from reset 364. The DLL input clock 316 may be sourced at the start-up frequency 358 in response to the indication that power of the chip is stable 368.

The DLL 204 may be configured to lock, initially, at the start-up frequency 358, following release of the DLL from reset 362 and prior to release of the chip from reset 364. The DLL 204 and chip may be released from reset, sequentially, in response to an indication that power of the chip is stable 368. For example, following a configured amount of time from the indication that power of the chip is stable 368, the DLL 204 may be released from reset 362.

Following such release, the DLL 204 locks to the start-up frequency 358 and the chip may be configured to be released from reset 364 via the chip reset signal 352 with the DLL 204 locked at the start-up frequency 358, enabling the second insertion delay of the variable delay line path 212 to match the first insertion delay of the fixed delay line path 208, with the DLL 104 locked at one or more higher frequencies relative to the start-up frequency 358, wherein any given frequency of the one or more higher frequencies may be the target frequency.

The DLL 104 locks at each of the one or more higher frequencies without cycle slipping. Locking is accomplished without cycle slipping because insertion delay of the variable delay line path 212 matches that of the fixed delay line path 208 as opposed to being +/−n*T relative to the first insertion delay of the fixed delay line path 208, where n is an integer and T is a clock period of the reference clock 222, that is, a clock period of the DLL input clock 216.

Figure 4:
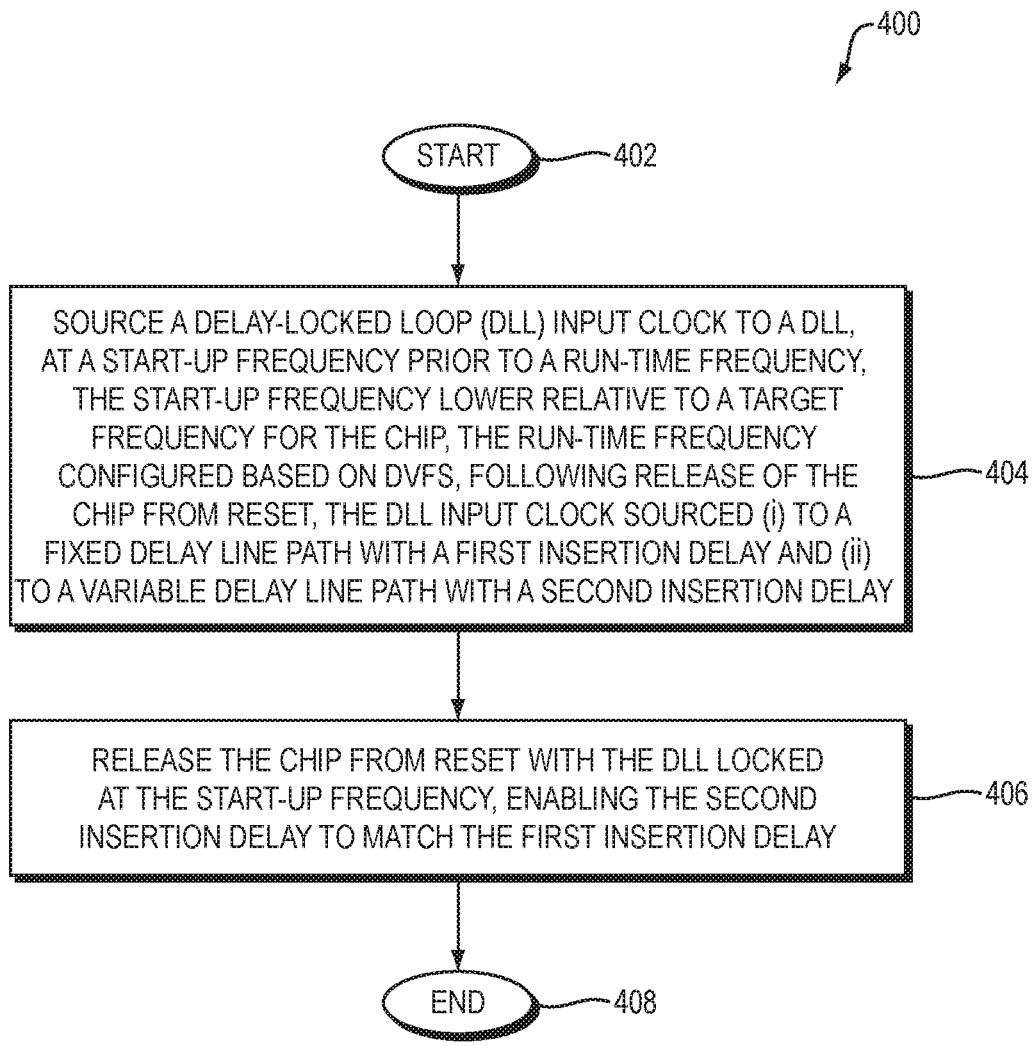
FIG. 4 is a flow diagram of an example embodiment of a method for dynamic voltage frequency scaling on a chip.

FIG. 4 is a flow diagram 400 of an example embodiment of a method for dynamic voltage frequency scaling (DVFS)

on a chip. The method begins (402) and sources a delay-locked loop (DLL) input clock to a DLL, at a start-up frequency prior to a run-time frequency, the start-up frequency lower relative to a target frequency for the chip, the run-time frequency configured based on DVFS, following release of the chip from reset, the DLL input clock sourced (i) to a fixed delay line path with a first insertion delay and (ii) to a variable delay line path with a second insertion delay (404). The method may release the chip from reset with the DLL locked at the start-up frequency, enabling the second insertion delay to match the first insertion delay with the DLL locked at the start-up frequency (406), and the method thereafter ends (408) in the example embodiment.

The method may further comprise increasing the run-time frequency of the DLL input clock from the start-up frequency to the target frequency following release of the chip from reset, the second insertion delay matched with the first insertion delay with the DLL locked at the target frequency. The increasing may include increasing the run-time frequency of the DLL input clock, gradually, from the start-up frequency to the target frequency, by increasing the run-time frequency to at least one intermediate frequency. The at least one intermediate frequency may be higher relative to the start-up frequency and lower relative to the target frequency, the second insertion delay matched with the first insertion delay with the DLL locked at each at least one intermediate frequency.

The method may further comprise releasing the DLL and chip from reset, sequentially, by releasing the DLL from reset prior to releasing the chip from reset. The releasing may include releasing the DLL and chip from reset, sequentially, in response to an indication that power of the chip is stable. The method may further comprise sourcing the DLL input clock at the start-up frequency in response to an indication that power of the chip is stable, as disclosed above with regard to FIG. 3.

The method may further comprise causing the DLL to lock, initially, at the start-up frequency, following release of the DLL from reset and prior to release of the chip from reset. Sourcing the DLL input clock may include sourcing the DLL input clock from a clock generator, wherein the clock generator includes multiple phase-locked loops (PLLs), such as disclosed above with regard to FIG. 2. The method may further comprise selecting a given phase-locked loop (PLL) of the multiple PLLs to source the DLL input clock at the start-up frequency, the given PLL programmed at the start-up frequency.

Selecting the given PLL may include selecting the given PLL, such as PLL0 of FIG. 2, programmed at the start-up frequency in response to an indication that power of the chip is stable, as disclosed above with regard to FIG. 3. The method may further comprise selecting a different PLL, such as PLL1 of FIG. 2, from the multiple PLLs to source the DLL input clock at a higher frequency following release of the chip from reset, such as disclosed with regard to FIG. 3, above. The higher frequency may be higher relative to the start-up frequency. The different PLL may be different from the given PLL.

The DLL may further include a phase detector and a finite state machine (FSM), the phase detector coupled to the fixed and variable delay line paths and the FSM, as disclosed above with regard to FIGS. 1A-B and FIG. 2, and the method may further comprise releasing the DLL from reset by releasing the FSM from reset. Releasing the FSM from reset may include (i) releasing the FSM from reset in response to an indication that power of the chip is stable and (ii) releasing the FSM from reset prior to release of the chip from reset, as disclosed above with regard to FIG. 3.

The method may further comprise inputting the DLL input clock to the fixed delay line path and outputting a reference clock from the fixed delay line path to the phase detector; inputting the DLL input clock to the variable delay line path and outputting a feedback clock from the variable delay line path to the phase detector; generating a phase difference by the phase detector based on a comparison of respective phases of the reference and feedback clocks; and controlling delay of the variable delay line path via the FSM as a function of the phase difference, as further disclosed above with regard to FIGS. 1A-B and FIG. 2.

The fixed delay line path may include a fixed delay line circuit and a first clock distribution circuit, the first clock distribution circuit coupled to the fixed delay line circuit. The variable delay line path may include a variable delay line circuit and a second clock distribution circuit. The second clock distribution circuit may be coupled to the variable delay line circuit, as disclosed above with regard to FIG. 2. Controlling delay of the variable delay line path may include controlling a variable delay of the variable delay line circuit via the FSM as a function of the phase difference.

The fixed delay line path may include a fixed delay line circuit and a first clock distribution circuit, the variable delay line path may include a variable delay line circuit and a second clock distribution circuit, the first insertion delay may be fixed, and the second insertion delay may be variable, as disclosed above. The method may further comprise sourcing the DLL input clock from a clock generator; causing latency of the DLL input clock from the clock generator via the first fixed delay, wherein the first fixed delay is a first aggregation of respective fixed delays of the fixed delay line and first clock distribution circuits; and causing latency of the DLL input clock from the clock generator via the second insertion delay. The second insertion delay may be a second aggregation of a controllable variable delay of the variable delay line circuit and a second fixed delay of the second clock distribution circuit.

The chip may include a DVFS controller, as disclosed above, and the method may further comprise sourcing the DLL input clock, following release of the chip from reset, at the run-time frequency specified by the DVFS controller. The second insertion delay is caused to match the first insertion delay with the DLL locked at each frequency specified for the run-time frequency by the DVFS controller.

Figure 5A:
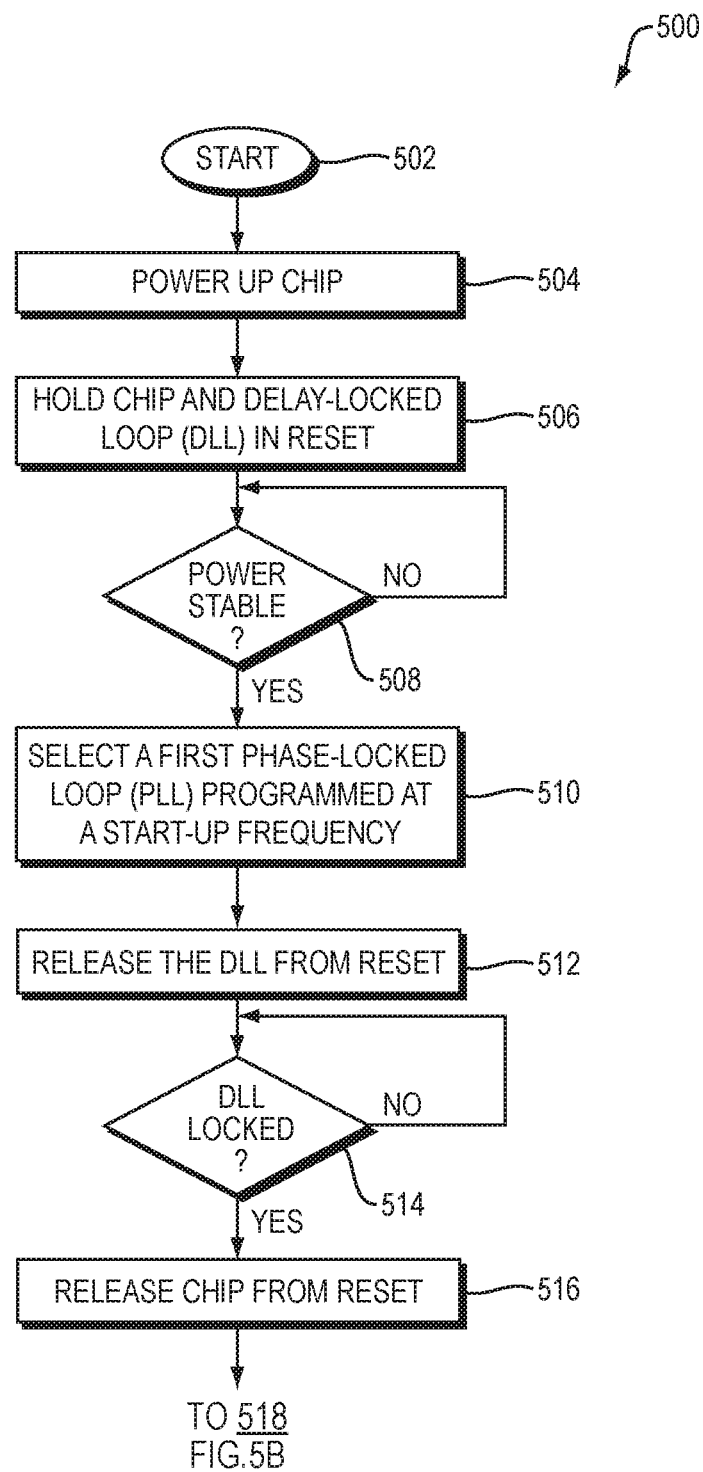
FIGS. 5A-B are flow diagrams of another example embodiment of a method for dynamic voltage frequency scaling on a chip.
Figure 5B:
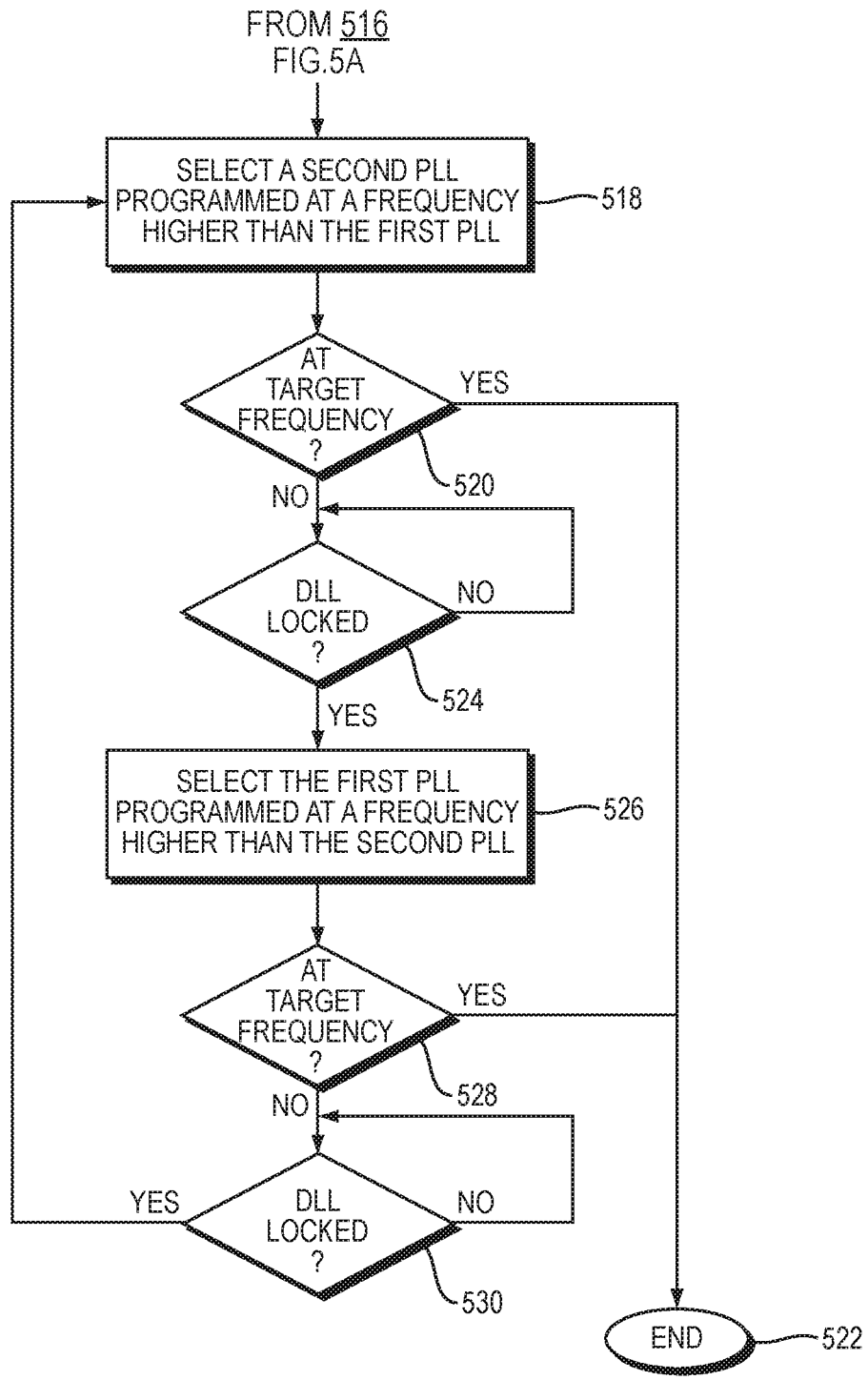

FIGS. 5A-B disclose a flow diagram 500 of another example embodiment of a method for dynamic voltage frequency scaling (DVFS) on a chip. The method begins (502) and powers up a chip (504). The method holds the chip and a DLL in reset (506). The method checks for whether power of the chip is stable (508) and, if not, the method continues to check (508). If power of the chip is stable, the method selects a first PLL that is programmed at a start-up frequency (510) and releases the DLL from reset (512). The method checks for whether the DLL is locked at the start-up frequency by waiting a fixed amount of time or detecting lock of the DLL (514). If the DLL is not locked, the method continues to check for DLL lock (514). If the DLL is locked, the method releases the chip from reset (516).

The method selects a second PLL programmed at a frequency higher than that of the first PLL (518). The method checks for whether the frequency, that is, the frequency at which the second PLL is currently programmed, is a target frequency (520). If yes, the method thereafter ends (522) in the example embodiment.

If the frequency is not the target frequency, the method checks for DLL lock (524). If the DLL is not locked, the method continues to check for DLL lock (524). Determining that the DLL has locked may be determined by verifying that an amount of time since selecting the second PLL has expired or may be determined by detecting DLL lock based on a check of the phase difference between the reference and feedback clocks disclosed above with regard to FIGS. 1A-B and FIG. 2.

If the DLL has locked, the method selects the first PLL, the first PLL programmed at a frequency higher than the second PLL (526). The method checks for whether the frequency, that is, the frequency at which the first PLL is currently programmed, is the target frequency (528). If yes, the method thereafter ends (522) in the example embodiment.

If the frequency is not the target frequency, the method checks for DLL lock (524). If the DLL is not locked, the method continues to check for DLL lock (530). Determining that the DLL has locked may be determined by verifying that an amount of time since selecting the first PLL has expired or may be determined by detecting DLL lock based on a check of the phase difference between the reference and feedback clocks disclosed above with regard to FIGS. 1A-B and FIG. 2. If the DLL has locked, the method again selects the second PLL, the second PLL programmed at a frequency higher than the first PLL (518) and the method continues as disclosed above.

Further example embodiments disclosed herein may be configured using a computer program product; for example, controls may be programmed in software for implementing example embodiments. Further example embodiments may include a non-transitory computer-readable medium containing instructions that may be executed by a processor, and, when loaded and executed, cause the processor to complete methods described herein. It should be understood that elements of the block and flow diagrams may be implemented in software or hardware, firmware, a combination thereof, or other similar implementation determined in the future. In addition, the elements of the block and flow diagrams described herein may be combined or divided in any manner in software, hardware, or firmware. If implemented in software, the software may be written in any language that can support the example embodiments disclosed herein. The software may be stored in any form of computer readable medium, such as random-access memory (RAM), read only memory (ROM), compact disk read-only memory (CD-ROM), and so forth. In operation, a general purpose or application-specific processor or processing core loads and executes software in a manner well understood in the art. It should be understood further that the block and flow diagrams may include more or fewer elements, be arranged or oriented differently, or be represented differently. It should be understood that implementation may dictate the block, flow, and/or network diagrams and the number of block and flow diagrams illustrating the execution of embodiments disclosed herein. Further, example embodiments and elements thereof may be combined in a manner not explicitly disclosed herein.

While example embodiments have been particularly shown and described, it will be understood by those skilled in the art that various changes in form and details may be made therein without departing from the scope of the embodiments encompassed by the appended claims.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A circuit for dynamic voltage frequency scaling (DVFS) on a chip, the circuit comprising:
    a delay-locked loop (DLL) including a fixed delay line path with a first insertion delay and a variable delay line path with a second insertion delay; and
    a clock generator configured to source a DLL input clock to the fixed and variable delay line paths at a start-up frequency prior to a run-time frequency, the start-up frequency lower relative to a target frequency for the chip, the run-time frequency configured based on DVFS, following release of the chip from reset, the chip configured to be released from reset with the DLL locked at the start-up frequency, enabling the second insertion delay to match the first insertion delay with the DLL locked at the start-up frequency.

2. The circuit of claim 1, wherein the clock generator is further configured to increase the run-time frequency of the DLL input clock from the start-up frequency to the target frequency following release of the chip from reset, the second insertion delay matched with the first insertion delay with the DLL locked at the target frequency.

3. The circuit of claim 2, wherein the clock generator is further configured to increase the run-time frequency of the DLL input clock, gradually, by increasing the run-time frequency to at least one intermediate frequency, the at least one intermediate frequency higher relative to the start-up frequency and lower relative to the target frequency, the second insertion delay matched with the first insertion delay with the DLL locked at each at least one intermediate frequency.

4. The circuit of claim 1, further comprising a reset sequence circuit configured to release the DLL and chip from reset, sequentially, by releasing the DLL from reset prior to releasing the chip from reset.

5. The circuit of claim 4, wherein the reset sequence circuit is further configured to release the DLL and chip from reset, sequentially, in response to an indication that power of the chip is stable.

6. The circuit of claim 1, wherein the clock generator is further configured to source the DLL input clock at the start-up frequency in response to an indication that power of the chip is stable.

7. The circuit of claim 1, wherein the DLL is configured to lock, initially, at the start-up frequency, following release of the DLL from reset and prior to release of the chip from reset.

8. The circuit of claim 1, wherein the clock generator includes:
    multiple phase-locked loops (PLLs); and
    a clock selector, the clock selector configured to select a given phase-locked loop (PLL) of the multiple PLLs to source the DLL input clock at the start-up frequency, the given PLL programmed at the start-up frequency.

9. The circuit of claim 8, wherein the clock selector is further configured to select the given PLL programmed at the start-up frequency in response to an indication that power of the chip is stable.

10. The circuit of claim 8, wherein the clock selector is further configured to select a different PLL from the multiple PLLs to source the DLL input clock at a higher frequency following release of the chip from reset, wherein the higher frequency is higher relative to the start-up frequency and wherein the different PLL is different from the given PLL.

11. The circuit of claim 1, wherein the DLL further includes a finite state machine (FSM) and wherein the DLL is configured to be released from reset via release of the FSM from reset, the FSM configured to be released from reset (i) in response to an indication that power of the chip is stable and (ii) prior to release of the chip from reset.

12. The circuit of claim 1, wherein:
the DLL further includes a phase detector and a finite state machine (FSM), the phase detector coupled to the fixed and variable delay line paths and the FSM;
the circuit is configured to input the DLL input clock to the fixed and variable delay line paths, the fixed delay line path configured to output a reference clock to the phase detector, the variable delay line path configured to output a feedback clock to the phase detector;
the phase detector is configured to generate a phase difference based on a comparison of respective phases of the reference and feedback clocks; and
the FSM is configured to control delay of the variable delay line path as a function of the phase difference.

13. The circuit of claim 12, wherein:
the fixed delay line path includes a fixed delay line circuit and a first clock distribution circuit, the first clock distribution circuit interposed between the fixed delay line circuit and the phase detector;
the variable delay line path includes a variable delay line circuit and a second clock distribution circuit, the second clock distribution circuit interposed between the variable delay line circuit and the phase detector; and
the FSM is further configured to control delay of the variable delay line path by controlling a variable delay of the variable delay line circuit as a function of the phase difference.

14. The circuit of claim 1, wherein the DLL is one of multiple DLLs on the chip and wherein the clock generator is further configured to source the DLL input clock to the multiple DLLs.

15. The circuit of claim 1, wherein:
the fixed delay line path includes a fixed delay line circuit and a first clock distribution circuit;
the variable delay line path includes a variable delay line circuit and a second clock distribution circuit;
the first insertion delay is a first fixed delay and is configured to cause latency of the DLL input clock from the clock generator, wherein the first insertion delay is a first aggregation of respective fixed delays of the fixed delay line and first clock distribution circuits; and
the second insertion delay is a variable and is configured to cause latency of the DLL input clock from the clock generator, wherein the second insertion delay is a second aggregation of a controllable variable delay of the variable delay line circuit and a second fixed delay of the second clock distribution circuit.

16. The circuit of claim 1, wherein:
the chip includes a DVFS controller coupled to the clock generator; and
the clock generator is further configured to source the DLL input clock, following release of the chip from reset, at the run-time frequency specified by the DVFS controller, the second insertion delay caused to match the first insertion delay with the DLL locked at each frequency specified for the run-time frequency by the DVFS controller.

17. A method for dynamic voltage frequency scaling (DVFS) on a chip, the method comprising:
sourcing a delay-locked loop (DLL) input clock to a DLL, at a start-up frequency prior to a run-time frequency, the start-up frequency lower relative to a target frequency for the chip, the run-time frequency configured based on DVFS, following release of the chip from reset, the DLL input clock sourced (i) to a fixed delay line path with a first insertion delay and (ii) to a variable delay line path with a second insertion delay; and
releasing the chip from reset with the DLL locked at the start-up frequency, enabling the second insertion delay to match the first insertion delay with the DLL locked at the start-up frequency.

18. The method of claim 17, further comprising increasing the run-time frequency of the DLL input clock from the start-up frequency to the target frequency following release of the chip from reset, the second insertion delay matched with the first insertion delay with the DLL locked at the target frequency.

19. The method of claim 18, wherein the increasing includes increasing the run-time frequency of the DLL input clock, gradually, from the start-up frequency to the target frequency, by increasing the run-time frequency to at least one intermediate frequency, the at least one intermediate frequency higher relative to the start-up frequency and lower relative to the target frequency, the second insertion delay matched with the first insertion delay with the DLL locked at each at least one intermediate frequency.

20. The method of claim 17, further comprising releasing the DLL and chip from reset, sequentially, by releasing the DLL from reset prior to releasing the chip from reset.

21. The method of claim 20, wherein the releasing includes releasing the DLL and chip from reset, sequentially, in response to an indication that power of the chip is stable.

22. The method of claim 17, further comprising sourcing the DLL input clock at the start-up frequency in response to an indication that power of the chip is stable.

23. The method of claim 17, further comprising causing the DLL to lock, initially, at the start-up frequency, following release of the DLL from reset and prior to release of the chip from reset.

24. The method of claim 17, wherein sourcing the DLL input clock includes sourcing the DLL input clock from a clock generator, wherein the clock generator includes multiple phase-locked loops (PLLs), and wherein the method further comprises selecting a given phase-locked loop (PLL) of the multiple PLLs to source the DLL input clock at the start-up frequency, the given PLL programmed at the start-up frequency.

25. The method of claim 24, wherein selecting the given PLL includes selecting the given PLL programmed at the start-up frequency in response to an indication that power of the chip is stable.

26. The method of claim 24, further comprising selecting a different PLL from the multiple PLLs to source the DLL input clock at a higher frequency following release of the chip from reset, wherein the higher frequency is higher relative to the start-up frequency and wherein the different PLL is different from the given PLL.

27. The method of claim 17, wherein the DLL further includes a finite state machine (FSM) and wherein the method further comprises releasing the DLL from reset by releasing the FSM from reset, wherein releasing the FSM from reset includes (i) releasing the FSM from reset in response to an indication that power of the chip is stable and (ii) releasing the FSM from reset prior to release of the chip from reset.

28. The method of claim 17, wherein the DLL further includes a phase detector and a finite state machine (FSM), the phase detector coupled to the fixed and variable delay line paths and the FSM, and wherein the method further comprises:
  inputting the DLL input clock to the fixed delay line path and outputting a reference clock from the fixed delay line path to the phase detector;
  inputting the DLL input clock to the variable delay line path and outputting a feedback clock from the variable delay line path to the phase detector;
  generating a phase difference by the phase detector based on a comparison of respective phases of the reference and feedback clocks; and
  controlling delay of the variable delay line path via the FSM as a function of the phase difference.

29. The method of claim 28, wherein:
  the fixed delay line path includes a fixed delay line circuit and a first clock distribution circuit, the first clock distribution circuit interposed between the fixed delay line circuit and the phase detector;
  the variable delay line path includes a variable delay line circuit and a second clock distribution circuit, the second clock distribution circuit interposed between the variable delay line circuit and the phase detector; and
  controlling delay of the variable delay line path includes controlling a variable delay of the variable delay line circuit via the FSM as a function of the phase difference.

30. The method of claim 17, wherein the DLL is one of multiple DLLs on the chip and wherein the method further comprises sourcing the DLL input clock to the multiple DLLs.

31. The method of claim 17, wherein the fixed delay line path includes a fixed delay line circuit and a first clock distribution circuit, the variable delay line path includes a variable delay line circuit and a second clock distribution circuit, wherein the first insertion delay is fixed, wherein the second insertion delay is variable, and wherein the method further comprises:
  sourcing the DLL input clock from a clock generator;
  causing latency of the DLL input clock from the clock generator via the first fixed delay, wherein the first fixed delay is a first aggregation of respective fixed delays of the fixed delay line and first clock distribution circuits; and
  causing latency of the DLL input clock from the clock generator via the second insertion delay, wherein the second insertion delay is a second aggregation of a controllable variable delay of the variable delay line circuit and a second fixed delay of the second clock distribution circuit.

32. The method of claim 17, wherein the chip includes a DVFS controller and wherein the method further comprises sourcing the DLL input clock, following release of the chip from reset, at the run-time frequency specified by the DVFS controller, the second insertion delay caused to match the first insertion delay with the DLL locked at each frequency specified for the run-time frequency by the DVFS controller.

* * * * *

UNITED STATES PATENT AND TRADEMARK OFFICE
CERTIFICATE OF CORRECTION

PATENT NO. : 10,784,871 B1
APPLICATION NO. : 16/528381
DATED : September 22, 2020
INVENTOR(S) : Thucydides Xanthopoulos and Nitin Mohan Page 1 of 1

It is certified that error appears in the above-identified patent and that said Letters Patent is hereby corrected as shown below:

In the Specification

In Column 4, Line 14, delete "dynamical" and insert --dynamically--

In Column 5, Line 41, delete "such" and insert --such as--

In Column 6, Line 29, delete "142$a$)," and insert --142$a$)],--

In Column 6, Line 37, delete "142$a$)" and insert --142$a$)]--

In Column 7, Line 26, delete "142$a$)," and insert --142$a$)],--

In Column 7, Line 40, delete "is may" and insert --may--

Signed and Sealed this
Fourth Day of July, 2023

Katherine Kelly Vidal
*Director of the United States Patent and Trademark Office*